United States Patent
Cahalen et al.

(10) Patent No.: US 7,190,016 B2
(45) Date of Patent: Mar. 13, 2007

(54) CAPACITOR STRUCTURE

(75) Inventors: John P. Cahalen, Somerville, MA (US); Maria Anna Rzeznik, Framingham, MA (US); John E. Schemenaur, Marlborough, MA (US); Rajan Hariharan, Duluth, GA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 11/243,890

(22) Filed: Oct. 5, 2005

(65) Prior Publication Data

US 2006/0079050 A1 Apr. 13, 2006

Related U.S. Application Data

(60) Provisional application No. 60/617,111, filed on Oct. 8, 2004.

(51) Int. Cl.
*H01L 27/108* (2006.01)
*H01L 29/76* (2006.01)
*H01L 29/94* (2006.01)
*H01L 31/119* (2006.01)

(52) U.S. Cl. .......... 257/310; 257/296; 257/E21.08; 257/E21.04; 257/E21.061; 438/240; 438/238; 438/381

(58) Field of Classification Search .......... 257/296, 257/249, 288, 301, 306, 310, 315, 761, 762, 257/763; 438/240, 238, 381
See application file for complete search history.

(56) References Cited

U.S. PATENT DOCUMENTS 5,413,838 A * 5/1995 Azuma et al. ............ 428/194
5,454,926 A 10/1995 Clouser et al.
5,482,784 A 1/1996 Ohara et al.
5,545,466 A * 8/1996 Saida et al. ................. 428/209
5,858,517 A 1/1999 Tagusari et al.
5,897,761 A * 4/1999 Tagusari et al. ............ 205/77
6,180,252 B1 1/2001 Farrell et al.
6,291,081 B1 9/2001 Kurabe et al.
6,610,417 B2 8/2003 Andresakis et al.
6,657,849 B1 * 12/2003 Andresakis et al. ......... 361/311
6,661,642 B2 12/2003 Allen et al.
6,693,793 B2 2/2004 Kuwako et al.
6,781,506 B2 * 8/2004 Schemenaur et al. ....... 338/307
2001/0024387 A1 9/2001 Raaijmakers et al.
2003/0128496 A1 7/2003 Allen et al.
2003/0219956 A1 11/2003 Mori et al.
2003/0231099 A1 12/2003 Schemenaur et al.
2004/0109298 A1 6/2004 Hartman et al.
2004/0126484 A1 7/2004 Croswell et al.

FOREIGN PATENT DOCUMENTS

EP    1 191 555 A2    3/2002

OTHER PUBLICATIONS

ASME Standard B46.1-2002; pp. 1-98.

* cited by examiner

*Primary Examiner*—David Nhu
(74) *Attorney, Agent, or Firm*—S. Matthew Cairns (57) ABSTRACT

Structures including a capacitor dielectric material disposed on the surface of an electrode suitable for use in forming capacitors are disclosed. Methods of forming such structures are also disclosed.

10 Claims, 7 Drawing Sheets

Fig. 7
Comparative

CAPACITOR STRUCTURE

CROSS-REFERENCE TO RELATED APPLICATIONS

This application claims the benefit of U.S. provisional application Ser. No. 60/617,111, filed on Oct. 8, 2004.

BACKGROUND OF THE INVENTION

The present invention relates generally to the field of capacitors. In particular, the present invention relates to capacitors that can be embedded within a laminate dielectric material, such as in the manufacture of a printed circuit board.

Laminated printed circuit boards, as well as multichip modules, serve as support substrates for electronic components, such as integrated circuits, capacitors, resistors, inductors, and other components. Conventionally, discrete passive components, e.g. resistors, capacitors and inductors, are surface mounted to the printed circuit boards. Such surface-mounted discrete passive components can occupy a large amount of the real estate of a printed circuit board, thus limiting the space available for the mounting of active components, such as integrated circuits. The removal of passive components from the printed circuit board surface allows for increased density of active components, further miniaturization of the printed circuit board, increased computing power, reduced system noise and reduced noise sensitivity due to shortened leads. Embedding passive components within the laminated printed circuit board structure allows such components to be removed from the surface of the printed circuit board.

The capacitance density of a capacitor depends upon the thickness of the dielectric material, the dielectric constant of the dielectric material and the area of the electrodes. Decreasing the thickness of the dielectric material increases the capacitance density of the capacitor. The greater the capacitance density of a capacitor is, the smaller the required area is for the capacitor. Shrinking the area used by a capacitor also shrinks the amount of printed circuit board space required to use that capacitor. Thus, capacitors having thinner dielectric layers and accordingly smaller areas are desired. However, as the dielectric material layer becomes thinner, the topography of the underlying conductive substrate (electrode) becomes a significant consideration.

Conventional embeddable thin-film capacitor structures are typically prepared by the deposition of a dielectric material on a conductive substrate, such as a copper foil, with another conductive layer deposited on the dielectric material opposite the conductive substrate. The copper foils used to make these embeddable capacitors are those foils conventionally used in the printed circuit board industry.

Copper foils are typically produced by the electrodeposition of copper from a solution onto a rotating drum. The surface of the copper foil adjacent the drum is the smooth (or shiny) surface while the other surface has a much higher roughness (the matte side). The matte surface of the foil typically provides better adhesion to a substrate, e.g. a polymeric layer such as a photoresist or polymeric dielectric material such as glass reinforced epoxy. The topographic structure of metal foils are conventionally evaluated by looking at the roughness of the surface, that is the peak-to-valley distance.

Applying the capacitor dielectric material to the matte surface of the foil is thought to improve the adhesion between the capacitor dielectric material and the foil, as in the case of polymeric coatings. Thus, the rougher the surface, the better the adhesion of the capacitor dielectric material to the foil. However, very rough surfaces cause other problems when thin capacitor dielectric material layers are used. A rougher foil surface requires more capacitor dielectric material be deposited than a smoother foil surface to obtain a structure having a given capacitance density. The addition of more capacitor dielectric material requires additional deposition procedures as compared to those required for a smoother foil. Such additional procedures may add greatly to the cost of the process.

A foil surface that is too rough may cause uniformity problems in the capacitor dielectric material layer, leading to shorts. A foil surface that is too smooth may adversely affect the adhesion of the capacitor dielectric material to the foil. What is desired for thin-film capacitor manufacture is a metal foil having a sufficient smoothness to provide a thinner capacitor dielectric material layer having a desired capacitance uniformity while still providing sufficient adhesion to the capacitor dielectric material.

U.S. patent application Ser. No. 2003/0068517 (Andresakis et al.) discloses nickel coated copper foil for embedded passive devices. In this patent application, conventional copper foils are used. This patent application fails to appreciate the balance of the levels of roughness and smoothness required to prepare embeddable thin-film dielectric-containing capacitors without having an appreciable number of shorts.

SUMMARY OF THE INVENTION

The present invention addresses the above needs by providing a structure including an electrode having first and second surfaces and a capacitor dielectric material disposed on the first surface of the electrode, wherein the first surface of first electrode has an Ra value of $\leq 200$ nm, an Rz(din) value of $\leq 2000$ nm, and a W value of $\leq 250$ nm.

Also provided by the present invention is a structure including an electrode having first and second surfaces, a barrier layer disposed on the first surface of the electrode and a capacitor dielectric material disposed on the barrier layer, wherein the barrier layer is an electrodeposited nickel layer and containing <3 atomic % of copper.

Further, the present invention provides a method of forming an electrode structure comprising the steps of providing a metal foil having a first surface, contacting the metal foil with a nickel electroplating bath and applying sufficient anodic potential to deposit a layer of nickel on the first surface of the metal foil wherein the nickel-plated first surface has an Ra value of $\leq 200$ nm, an Rz(din) value of $\leq 2000$ nm, and a W value of $\leq 250$ mm.

BRIEF DESCRIPTION OF THE DRAWINGS

In the figures, like reference numerals refer to similar elements.

DETAILED DESCRIPTION OF THE INVENTION

As used throughout this specification, the following abbreviations shall have the following meanings, unless the context clearly indicates otherwise: ° C.=degrees Centigrade; rpm=revolutions per minute; mol=moles; hr=hours; min=minute; sec=second; mu=nanometers; μm=micrometers; cm=centimeters; in.=inches; nF=nanofarads; and wt %=percent by weight.

The terms "printed wiring board" and "printed circuit board" are used interchangeably throughout this specification. "Depositing" and "plating" are used interchangeably throughout this specification and include both electroless plating and electrolytic plating. "Multilayer" refers to two or more layers. The term "capacitor dielectric material" refers to a layer or layers of dielectric material used to form a capacitor. "Laminate dielectric material" refers to an organic dielectric material that is used in the manufacture of multilayer materials and which is capable of having an item, such as a capacitor, embedded within it. "Alkyl" refers to linear, branched and cyclic alkyl. The terms "a" and "an" refer to the singular and the plural. All percentages are by weight, unless otherwise noted. All numerical ranges are inclusive and combinable in any order, except where it is clear that such numerical ranges are constrained to add up to 100%.

In general, the dielectric structures of the present invention are formed by disposing a layer of capacitor dielectric material on an electrode. Such structure is suitable for the fabrication of capacitors. The present invention provides a structure including an electrode having first and second surfaces and a capacitor dielectric material disposed on the first surface of the electrode, wherein the first surface of the electrode has an Ra value of $\leq 200$ nm, an Rz(din) value of $\leq 2000$ nm, and a W value of $\leq 250$ nm. The first and second electrode surfaces refer to first and second major surfaces of the electrode.

The first electrode includes a first conductive layer. A wide variety of conductive layers may be suitably employed in the present invention. Typically, the conductive layer is a metal layer. Such conductive layers may be self-supporting, as in the case of a metal foil, or may be deposited on a substrate. Suitable metal foils include, but are not limited to, copper, silver, nickel, platinum, iridium, gold, tin, aluminum, and alloys thereof such as stainless steel. Suitable alloys include, but are not limited to, those containing tin such as tin copper or tin bismuth, chromium, and bismuth. Preferred metal foils are copper, silver, gold, platinum, aluminum, nickel, titanium and stainless steel.

Conductive metal foils suitable for use in the present invention may have a wide range of thicknesses. Typically, such conductive metal foils have nominal thicknesses ranging from 0.005 mm to 0.5 mm (0.0002 to 0.02 in.). Metal foil thicknesses are often expressed in terms of weights. For example, suitable copper foils have weights of from 3.5 to 397 g per 929 $cm^2$ (0.125 to 14 ounces per square foot), particularly 7 to 170 g per 929 $cm^2$ (0.25 to 6 ounces per square foot), and more particularly from 14 to 140 g per 929 $cm^2$ (0.5 to 5 ounces per square foot).

The metal foils may be prepared using conventional electrodeposition techniques. For example, the conductive foils are prepared using drum cathodes having a surface sufficient to impart the desired level of surface roughness to the drum surface of the foil. In this manner, foils having an Ra value of $\leq 200$ nm, an Rz(din) value of $\leq 2000$ nm, and a W value of $\leq 250$ nm may be produced without the need for subsequent surface treatments. This can be done using conventional polishing methods. Alternatively, the drum can be coated with a photoresist, either dry film or liquid photoresist, and then imaged through a mask using the appropriate wavelength of actinic radiation followed by development of the photoresist. The drum is then etched and the remaining photoresist is stripped to provide a drum having the desired surface texture. Such textured drum will provide foils having the desired surface smoothness.

Alternatively, a suitable metal foil may be obtained by surface treatment or surface modification of a conventional metal foil. For example, a layer of a conductive material, such as nickel, copper, or silver, may be deposited on the surface of a conventional metal foil in such a manner so as to provide a surface having an Ra value of $\leq 200$ nm, an Rz(din) value of $\leq 2000$ nm, and a W value of $\leq 250$ nm. Such layer of conductive material may be deposited on the metal foil by a variety of techniques, including, without limitation, sputtering, electrodeposition, electroless deposition, and immersion plating. In another example, the metal foil may be chemically polished. Chemical polishing employs an etchant to selectively remove a portion of the foil surface to provide a smooth, level foil and typically produces a bright finish on copper. Chemical polishing is particularly suitable when the starting metal foil is rougher than desired. Optionally, the metal foil may be pre-cleaned prior to chemical polishing, such as by contacting the metal foil with a suitable cleaner (such as RONACLEAN GP-300 LF, available from Rohm and Haas Electronic Materials). The metal foil is polished by contacting it with a suitable etchant (such as CHEM-POLISH 14-1 BRIGHT DIP, available from Rohm and Haas Electronic Materials), followed by rinsing with water, and then metal plating to provide the metal foil having the desired surface roughness. Such metal plating may be electroless, such as electroless nickel, or electrolytic.

Conductive layers deposited on a substrate include self-supporting and non-self-supporting layers disposed on a substrate. Exemplary self-supporting conductive layers on a substrate include metal foils laminated to a substrate, such as a polymeric dielectric material, e.g. an epoxy or glass-filled epoxy material. Non-self-supporting conductive layers include thin metal layers that are deposited directly on a substrate. Substrates include, but are not limited to, metals including conductive and non-conductive metals and dielectric materials. Exemplary dielectric materials include organic dielectric materials, inorganic dielectric materials and mixtures thereof. Suitable dielectric materials include, but are not limited to, polyimides, polyacrylates, polyarylene ethers, polysulfones, epoxies, glass-filled organic dielectrics such as glass-filled epoxies or polyimides, and ceramics. The conductive layer may be deposited on the substrate by a variety of means including, but not limited to, sputtering, chemical vapor deposition ("CVD"), physical vapor deposition, combustion chemical vapor deposition ("CCVD"), controlled atmosphere CCVD ("CACCVD"), electroplating, electroless plating, immersion plating and lamination.

The first electrode of the present invention has a surface having an Ra value of $\leq 200$ nm, an Rz(din) value of $\leq 2000$ nm, and a W value of $\leq 250$ nm. The roughness of a surface typically consists of the finer irregularities of surface texture and includes Ra and Rz (din). "Ra" refers to the arithmetic average of the absolute values of the profile (peak) height deviations from a mean line recorded within a certain evaluation length (average roughness). In one embodiment, Ra is ≦100 nm and more typically ≦50 nm. Ra values are suitably from 1 to 200 nm. Rz (din) value is the average maximum peak-to-valley height of any five consecutive sampling lengths within the measurement length, which was 500 µm. The peak-to-valley distance is the distance between the height of a surface feature and a trough or valley in the surface. A "peak" is the point of maximum height on a given portion of the profile that lies above a centerline. A "valley" is a point of maximum depth on a given portion of a profile that lies below a centerline. In one embodiment, Rz (din) is ≦1000 nm and more typically ≦600 nm. A suitable range of Rz (din) values is from 1 to 2000 nm, typically 100 to 2000 nm, more typically from 200 to 1000 nm, and even more typically from 200 to 600 nm. Waviness is a more widely spaced component of surface texture and includes all irregularities whose spacing is greater than the roughness sampling length and less than the waviness sampling length. The waviness height ("W") is the peak-to-valley height of a modified profile from which roughness has been removed by filtering through a 10 µm filter. In one embodiment, W is ≦150 nm, and more typically ≦75 nm. An exemplary range of values for W is 1 to 250 nm. Further descriptions of the roughness and waviness parameters and methods of determining the values of these parameters are provided in the standard ASME B46.1-2002, *Surface Texture (Surface Roughness, Waviness, and Lay)*, American Society of Mechanical Engineers, 2003. Surface roughness of the metal foil may be measured using any suitable conventional profilometer.

The first electrode of the present invention may optionally include a barrier layer disposed on the conductive layer. Barrier layers typically function to prevent oxidation of the conductive layer and may also diminish the coefficient of thermal expansion mismatch between the metal foil and the capacitor dielectric material. In the case of a copper conductive layer, a barrier layer prevents migration of the copper into the capacitor dielectric material. Copper migration is a well-known cause of shorts. The barrier layer may be on either surface of the conductive layer or on both surfaces of the conductive layer. Typically, the barrier is at least on the surface nearest the capacitor dielectric material. When the conductive layer is a copper foil, it is preferred that a barrier layer is used. The thickness of the barrier layer may vary over a wide range, such as, but not limited to, 0.1 to 3 µm, and particularly 0.25 to 2.5 µm.

Barrier layers are well known to those skilled in the art. Suitable barrier layers include, but are not limited to, zinc, indium, tin, nickel, cobalt, brass, and bronze. Preferred barrier layers are those having a coefficient of thermal expansion similar to that of the underlying conductive layer. The barrier layer may be deposited electrolytically, electrolessly, by immersion plating, by sputtering, by CVD, by CACCVD and by CCVD. Preferably, the barrier layer is deposited electrolytically, electrolessly or by immersion plating. A particularly suitable barrier layer for copper is a nickel-containing layer, and more specifically an electrodeposited nickel-containing layer. Chromium-containing layers, which function as barrier layers, are not preferred as chromium may be detrimental to certain capacitor dielectric materials. Additional adhesion promoters may be disposed between the barrier layer and the capacitor dielectric material, however, such adhesion promoters are not required.

In an alternate embodiment, the present invention provides a structure including an electrode having first and second sides, a barrier layer disposed on the first surface of the electrode and a capacitor dielectric material disposed on the barrier layer, wherein the barrier layer is an electrodeposited nickel layer containing <3 atomic % of copper in the bulk of the nickel layer. The nickel layer may be nickel or a suitable nickel-alloy such as nickel-phosphorus. The alloys nickel-chromium and nickel-copper are not particularly suitable for this application. The presence of ≧3 atomic % copper in the nickel layer significantly impacts the electrical properties as well as other properties of the nickel layer such as etching properties, adhesion of the nickel barrier layer to the conductive layer, thermal processing behavior and the subsequent process of embedding a capacitor in a laminate dielectric material. It is preferred that the copper in the electrodeposited nickel layer be present in an amount of ≦2 atomic %. Other suitable amounts of copper in the nickel layer are ≦1 atomic % and even ≦0.5 atomic %. High purity electroplated nickel layers can be accomplished by a variety of ways such as through the use of high purity nickel electroplating baths which are well within the ability of those skilled in the art, and by the electrodeposition of multiple nickel layers. For example, a first electrodeposited nickel layer is followed by a second electrodeposited nickel layer using a plating bath utilizing higher purity reagents. In one embodiment, the nickel layer has a first region having <3 atomic % of copper and a second region having ≦1 atomic %. In a particular embodiment, the first electrode includes a copper foil and a nickel barrier layer having a total thickness of 0.5 to 2 µm, wherein the barrier layer includes a first region adjacent the copper foil, such as up to 10 nm thick, having <3 atomic % of copper, a second region, such as from 10 to 20 nm, having ≦1 atomic % of copper, and a third region having ≦0.5 atomic % of copper. In another embodiment, the nickel layer contains ≦1 atomic % of each of iron and cobalt, and preferably is substantially free of each of iron and cobalt. The amounts of copper and other metal impurities are determined using conventional techniques such as EDS and XPS.

A further advantage of an electrodeposited barrier layer is that it can be used to tailor the surface roughness of a conductive layer to provide an electrode having a surface with the desired roughness, i.e. a surface roughness having an Ra value of ≦200 nm, an Rz(din) value of ≦2000 nm, and a W value of ≦250 nm. In this way, a conductive layer that does not have the desired surface roughness can be utilized provided that the desired surface roughness is obtained following deposition of a barrier layer.

For example, a metal foil having a first surface that does not possess the desired degree of roughness can be plated with nickel such that the resulting nickel-plated surface does possess the desired degree of roughness. Accordingly, the present invention provides a method of forming an electrode structure comprising the steps of providing a metal foil having a first surface, contacting the metal foil with a nickel electroplating bath and applying sufficient anodic potential to deposit a layer of nickel on the first surface of the metal foil wherein the nickel-plated first surface has an Ra value of ≦200 nm, an Rz(din) value of ≦2000 nm, and a W value of ≦250 nm. In one embodiment, the metal foil is a copper foil.

A wide variety of capacitor dielectric materials may be used in the present structures. Typically, the capacitor dielectric material is chosen from medium and high dielectric constant materials, as well as mixtures thereof. In one embodiment, the capacitor dielectric material has a dielectric constant ≧7. In another embodiment, the capacitor dielectric material has a dielectric constant such as ≧10, typically ≧25, more typically ≧50, and still more typically ≧100.

Exemplary medium and high dielectric constant capacitor materials include, but are not limited to, ceramics, metal oxides, polymeric materials and combinations thereof. Suitable ceramics and metal oxides include, without limitation, titanium dioxide ("$TiO_2$"), tantalum oxides such as $Ta_2O_5$, barium-titanates having the formula $Ba_aTi_bO_c$ wherein a and b are independently from 0.5 to 1.25 and c is 2.5 to 5, strontium-titanates such as $SrTiO_3$, barium-strontium-titanates such as those having the formula $Ba_xSr_yTi_zO_q$ where x and y are independently chosen from 0 to 1.25, z is 0.8 to 1.5 and q is 2.5 to 5, lead-zirconium-titanates such as $PbZr_yTi_{1-y}O_3$, the series of doped lead-zirconium-titanates having the formula $(Pb_xM_{1-x})(Zr_yTi_{1-y})O_3$ where M is any of a variety of metals such as alkaline earth metals and transition metals such as niobium and lanthanum, where x denotes lead content and y is the zirconium content of the oxide, lithium-niobium oxides such as $LiNbO_3$, lead-magnesium-titanates such as $(Pb_xMg_{1-x})TiO_3$, and lead-magnesium-niobium oxides such as $(Pb_xMg_{1-x})NbO_3$, and lead-strontium-titanates $(Pb_xSr_{1-x})TiO_3$. When the capacitor dielectric material includes $Ba_aTi_bO_c$, it is preferred that a and b are both 1 and c is 3, i.e. $BaTiO_3$. Other suitable capacitor dielectric materials include, but are not limited to: silsesquioxanes such as alkyl silsesquioxanes, aryl silsesquioxanes, hydridosilsesquioxanes and mixtures thereof; silica; siloxanes; and the like; including mixtures of any of the foregoing. Suitable alkyl silsesquioxanes include $(C_1-C_{10})$alkyl silsesquioxanes such as methyl silsesquioxanes, ethyl silsesquioxanes, propyl silsesquioxanes, and butyl silsesquioxanes. It is preferred that the capacitor dielectric material includes a ceramic, metal oxide or mixtures thereof. Ceramics are particularly useful dielectric materials in the present invention. Such ceramic capacitor dielectric materials may be used in a variety of crystal structures including, without limitation, perovskites ($ABO_3$), pyrochlores ($A_2B_2O_7$), rutile and other structural polymorphs that have suitable electrical properties for use as a capacitor dielectric.

When a polymer/ceramic or polymer/metal oxide composite capacitor dielectric material is used, the ceramic or metal oxide material may be blended as a powder with the polymer. When the ceramic or metal oxide is used without a polymer, such ceramic or metal oxide may be deposited by a variety of means, such as, but not limited to, sol-gel, meniscus coating, dip coating, physical and/or reactive evaporation, sputtering, laser-based deposition techniques, chemical vapor deposition, combustion chemical vapor deposition, controlled atmosphere chemical vapor deposition, hydride vapor phase deposition, liquid phase epitaxy, and electro-epitaxy. Preferably, such ceramic or metal oxide material is deposited by using sol-gel techniques.

In such sol-gel processes, as exemplified herein by the deposition of a barium strontium titanate ("BST") capacitor dielectric material, a solution of titanium alkoxide, barium precursor and strontium precursor are reacted at the desired stoichiometry and controllably hydrolyzed with a solvent/water solution. Preferred as the titanium alkoxide is titanium isopropoxide. The "barium precursor" may be selected from a variety of barium compounds such as barium carboxylates and the reaction product of a glycol and barium oxide. Exemplary barium carboxylates include, without limitation, barium formate, barium acetate, and barium propionate. Typical glycols are ethylene glycol and propylene glycol. The glycol-barium oxide reaction product is typically diluted with an alcohol prior to the addition of the titanium alkoxide. The "strontium precursor" may be any suitable strontium compound such as strontium carboxylates such as strontium formate, strontium acetate and strontium propionate. Suitable alcohols for use as diluents include, without limitation, ethanol, isopropyl alcohol, methanol, butanol and pentanol.

As an example of sol deposition techniques, BST may be prepared as follows. Barium acetate and strontium acetate are dissolved in a solution of lactic acid and water. A chelating agent is added to the solution and the solution heated to reflux. A suitable solvent is then added and water is distilled off to provide a Ba/Sr solution. In a separate reaction vessel, titanium isopropoxide is stirred with the chelating agent and the solvent to provide a Ti solution. The Ti solution is combined with the Ba/Sr solution and the mixture is heated to reflux. The reaction mixture is next diluted to volume with the solvent and the mixture, a BST sol, is ready for coating of the substrate, such as by spin-coating or meniscus coating.

A thin, adherent film of the hydrolyzed solution (or "sol") is then applied to the substrate by a suitable method, such as dip-coating, spin-coating at 1,000 to 3,000 rpm or meniscus coating. Meniscus coating is a particularly suitable technique.

In meniscus coating, the substrate is positioned on a vacuum chuck. The chuck is then inverted to place the substrate in a coating position over an applicator bar. The applicator bar is a tube having a closed end, an open end and a slot running along a length of the tube, the slot communicating with the interior of the tube, the applicator bar being disposed horizontally such that the slot is at an upper surface of the tube. Material, such as a sol, to be coated is provided to the applicator bar through the open end. In one embodiment, the material is pumped into the tube through the open end. In another embodiment, the applicator bar is disposed within a reservoir. The sol flows through the tube and exits the tube through the slot, forming a meniscus. The substrate is positioned over the applicator bar such that a surface of the substrate to be coated contacts the meniscus of the sol. The applicator bar moves beneath the substrate to provide a coating of the sol on the substrate surface. Alternatively, a web of substrate to be coated, such as a roll of metal foil, such as copper foil, and more particularly nickel-plated copper foil, may be passed over a moving, or in the alternative a stationary, applicator bar to coat the substrate surface.

Alternatively, the substrate to be coated with the capacitor dielectric material may be dipped into the sol at an average speed of 2 to 12 cm/min (1 to 5 in./min) and typically from 2 to 8 cm/min.

Following coating, the films are heated at a temperature of 200 to 600° C. for 5 to 15 minutes to volatilize the organic species and to render the dried "gel" film. Other suitable temperatures and times may be used, the selection of which are within the ability of those skilled in the art. Multiple coatings may be required for increased film thicknesses. While the majority of the organic matter and water is removed from the films by heating at 500° C.; the BST film is still only partially crystalline.

The thickness of a film or layer deposited from a sol-gel process depends, in part, upon the rotation rate (spin-coating), coating speed (e.g. meniscus coating) and the viscosity of the solution. Typically, the thickness of the layer is 25 nm or greater, more typically 50 nm or greater, and still more typically 100 nm or greater. A particularly useful thickness is in the range of 25 to 700 nm and more particularly from 50 to 250 nm. The total thickness of a capacitor dielectric structure is determined by the sum of the thicknesses of each layer in the dielectric structure.

The film is then annealed for a period of time to provide the desired crystalline structure. For example, such films may be annealed at the temperature range of 500 to 800° C. Typically, the duration of annealing is about 15 minutes, however a variety of annealing times may be used and depend upon the particular ceramic dielectric composition and substrate. The selection of such annealing time is within the ability of those skilled in the art. A desirable annealing condition is 555 to 650° C. for approximately 15 minutes. Such annealing may be performed in a variety of atmospheres such as air or inert atmospheres such as nitrogen and argon. The film may optionally be further annealed to improve the film's crystallinity. This optional step may involve heating the film such as at a rate of 200° C./hr in a suitable atmosphere to a final annealing temperature of 600 to 900° C., until the desired crystallinity is achieved. Alternatively, the film may be annealed using rapid thermal annealing techniques, which are well known to those skilled in the art.

The capacitor dielectric material may optionally include a second electrode plating enhancing region. A variety of plating enhancing regions may be used such as a region having pores or voids, such as those disclosed in U.S. Pat. No. 6,819,540 (Allen et al.), a region containing a plating dopant, such as those disclosed in U.S. Pat. No. 6,661,642 (Allen et al.), or a region having a positive topography dopant, such as those disclosed in copending U.S. patent application Ser. No. 11/191,486 (Rzeznik).

Capacitors typically contain a pair of electrodes with a capacitor dielectric material disposed between the electrodes. Capacitors can be prepared according to the present invention by disposing a second electrode on the capacitor dielectric material in the structure described above. Such second electrode being disposed on a surface of the capacitor dielectric material opposite to the surface adjacent the first electrode. The present capacitors are particularly useful in printed circuit board manufacture where they may be embedded in an organic polymeric dielectric material.

The second electrode includes a second conductive layer which may be any suitable conductive material, such as those described above. In addition, the second conductive layer may include conductive polymers. Suitable conductive polymers include, metal filled polymers such as copper-filled polymers and silver-filled polymers, polyacetylenes, polyanilines, polypyrroles, polythiophenes, and graphite. The second electrode includes the second conductive layer and may optionally include one or more of a barrier layer and a catalytic layer. Any of the barrier layers described above are suitable. A "catalytic layer" refers to a layer that catalytically promotes electrode formation, such as a layer that catalytically promotes electroless metal deposition or electroplating.

Either of the first and second electrodes, or both electrodes, may contain more than one conductive material layer. For example, an electrode useful in the present capacitors may include a layer of copper and a layer of nickel. Other combinations of conductive materials may suitably be employed. Either of the first and second electrodes, or both electrodes, may contain more than one barrier layer.

Figure 1A:
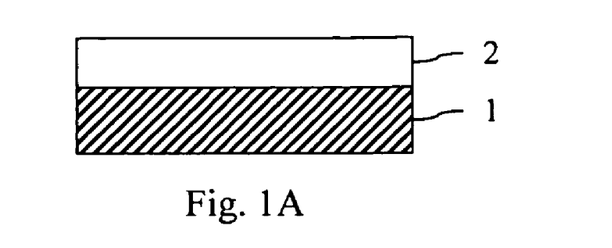
FIGS. 1A–1C illustrate a cross-sectional view of one embodiment of the invention.
Figure 1B:
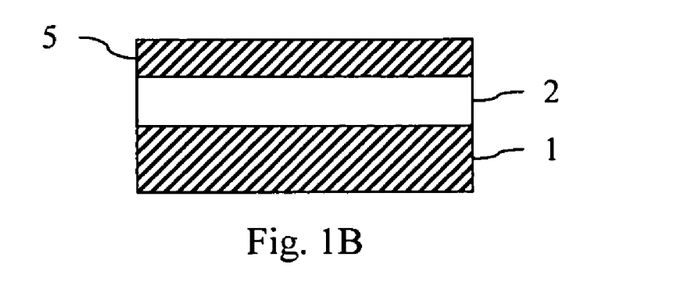
Figure 1C:
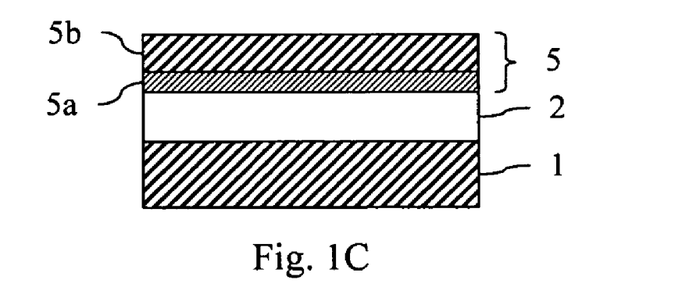

In FIG. 1A, which illustrates one embodiment of a structure of this invention, capacitor dielectric material 2 is disposed on first electrode 1. First electrode 1 is suitably a copper foil, and more particularly a nickel-plated copper foil. The capacitor dielectric is any suitable material, such as a ceramic and particularly BST, barium-titanate, lead-zirconium-titanate or lead-lanthanum-zirconium-titanate. When first electrode 1 is copper, it is preferred that the first electrode includes a barrier layer such as nickel, on one or both surfaces of the copper electrode. A capacitor is made by disposing a second electrode 5 on a surface of capacitor dielectric material 2, as shown in FIG. 1B. In such capacitor, the second electrode may be composed of any suitable conductive material. FIG. 1C illustrates a further embodiment of a capacitor including a second electrode 5 which includes a barrier layer 5a disposed between capacitor dielectric material 2 and a second conductive layer 5b. Accordingly, the present invention provides a capacitor including a first electrode, a second electrode and a capacitor dielectric material disposed between the first and second electrodes, a surface of the first electrode adjacent the capacitor dielectric material having an Ra value of $\leq 200$ nm, an Rz(din) value of $\leq 2000$ nm, and a W value of $\leq 250$ nm. Also provided by the present invention is a method of forming a capacitor including the steps of disposing a capacitor dielectric material on a surface of a first electrode, the surface having an Ra value of $\leq 200$ nm, an Rz(din) value of $\leq 2000$ nm, and a W value of $\leq 250$ nm; and disposing a second electrode on the capacitor dielectric material.

Figure 2A:
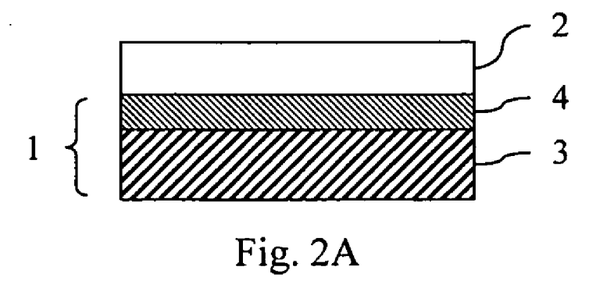
FIGS. 2A–2C illustrate a cross-sectional view of a further embodiment of the invention.
Figure 2B:
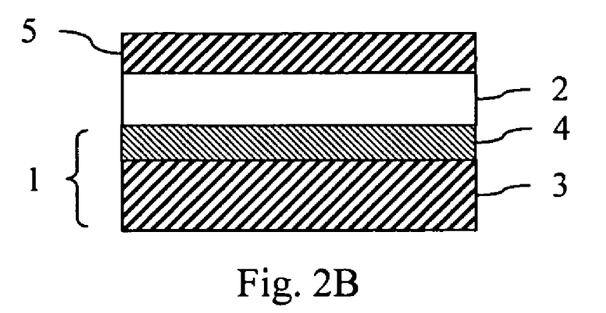
Figure 2C:
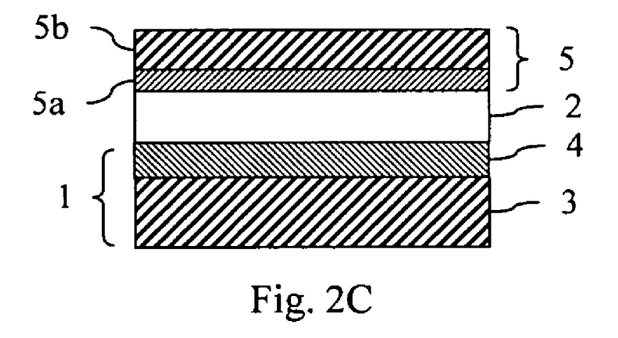

A further embodiment of the structure of the present invention is illustrated in FIG. 2A where capacitor dielectric material 2 is disposed on first electrode 1, which includes first conductive layer 3 and first barrier layer 4. A second barrier layer (not shown) may be disposed on a surface of conductive layer 3 opposite to that containing first barrier layer 4. The surface of first electrode 1 adjacent capacitor dielectric material has an Ra value of $\leq 200$ nm, an Rz(din) value of $\leq 2000$ nm, and a W value of $\leq 250$ nm. A capacitor is made by disposing a second electrode 5 on a surface of capacitor dielectric material 2, as shown in FIG. 2B. In such capacitor, the second electrode may be composed of any suitable conductive material. FIG. 2C illustrates a further embodiment of a capacitor including a first electrode 1, a second electrode 5 and capacitor dielectric material 2 disposed between the first and second electrodes, where first electrode 1 includes first conductive layer 3 and first barrier layer 4, and where second electrode 5 includes second barrier layer 5a and a second conductive layer 5b. It will be appreciated by those skilled in the art that a second barrier layer (not shown) may be disposed on the surface of the first conductive layer opposite the first barrier layer.

The capacitors of the present invention are particularly suitable for use as embedded capacitors in laminated printed circuit boards. Such capacitors are embedded in a laminate dielectric during the manufacture of laminated printed circuit boards. The laminate dielectrics are typically organic polymers such as epoxies, polyimides, fiber reinforced epoxies and other organic polymers used as dielectrics in the manufacture of printed circuit boards. In general, laminate dielectrics have a dielectric constant $\leq 6$, and typically have a dielectric constant in the range of 3 to 6. The present capacitors may be embedded by a variety of means known in the art, such as those disclosed in U.S. Pat. No. 5,155,655 (Howard et al.).

Figure 3A:
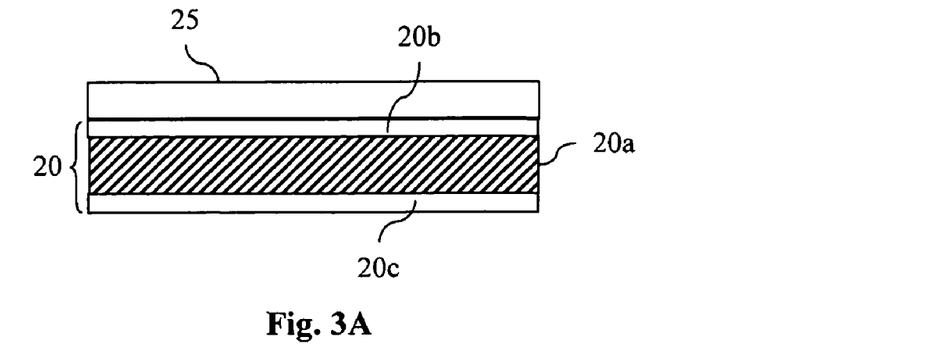
FIGS. 3A–3C illustrate one process of forming a capacitor of the invention.
Figure 3B:
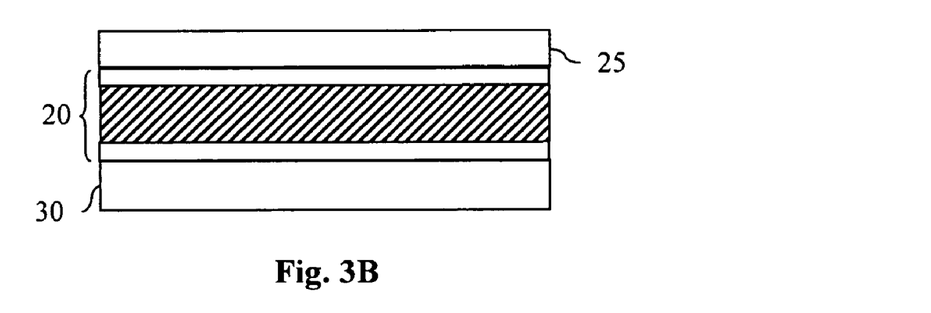
Figure 3C:
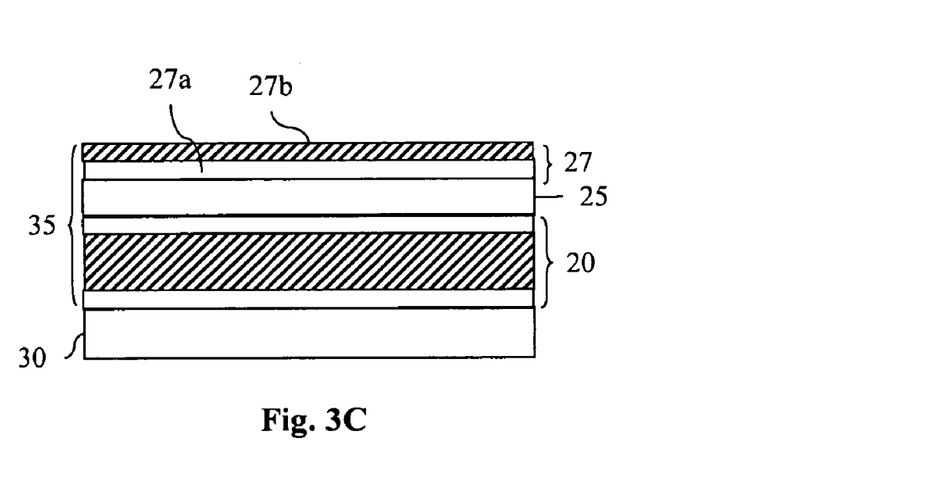

FIGS. 3A–3C illustrate one general method of forming an embeddable capacitor of the invention. Capacitor dielectric material layer 25 is coated on electrode 20, such as by meniscus coating. When dielectric layer 25 is composed of ceramic, such as BST, it typically includes deposition of multiple layers of BST precursor (not shown). When conductive substrate 20 is a coated foil such as nickel-coated copper foil, it contains a copper layer 20a having nickel layers 20b and 20c disposed on opposite major surfaces of copper layer 20a. It will be appreciated the layers 20b and 20c may also include additional layers of materials or alternate layers of materials. After annealing, the ceramic dielectric-coated electrode 20 is typically laminated to a polymeric laminate dielectric, 30, as shown in FIG. 3B. Next, second electrode 27 is provided to the surface of capacitor dielectric material layer 25, see FIG. 3C. Electrode 27 may be formed by any suitable means, such as by electroless plating followed by electrolytic plating. In one embodiment, electrode 27 includes first layer 27a such as an electroless nickel barrier layer and second layer 27b such as an electroplated copper layer.

Accordingly, the present invention provides a method of manufacturing a multilayer laminated printed circuit board including the step of embedding a structure in a layer of a multilayer laminated printed circuit board, wherein the embedded structure includes a capacitor dielectric material disposed on a surface of an electrode, wherein the surface has an Ra value of $\leq 200$ nm, an Rz(din) value of $\leq 2000$ nm, and a W value of $\leq 250$ nm. The capacitor dielectric material is in ohmic contact with the electrode. In an alternate embodiment, the present invention provides a method of manufacturing a multilayer laminated printed circuit board including the step of embedding a structure in a layer of a multilayer laminated printed circuit board, wherein the embedded structure includes a capacitor dielectric material disposed on a surface of an electrode, wherein the electrode includes a barrier layer disposed on the first surface of a conductive layer, wherein the barrier layer is an electrodeposited nickel layer comprising $\leq 0.5$ atomic % of copper, and wherein the barrier layer is in ohmic contact with the capacitor dielectric material.

Figure 4A:
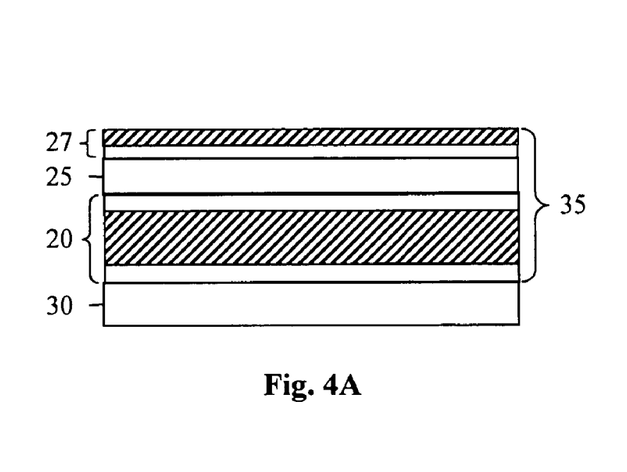
FIGS. 4A–4H illustrate one process of patterning a capacitor of the invention.
Figure 4B:
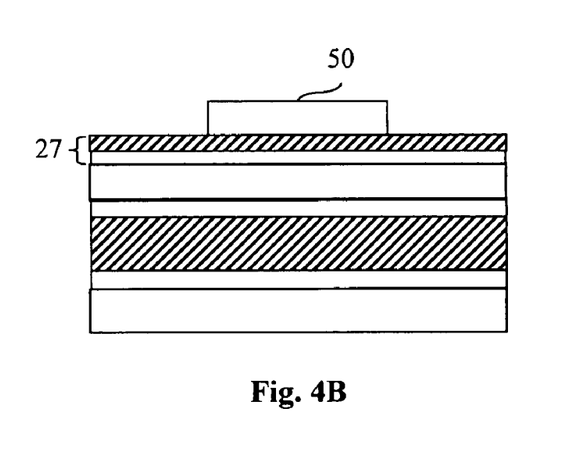
Figure 4C:
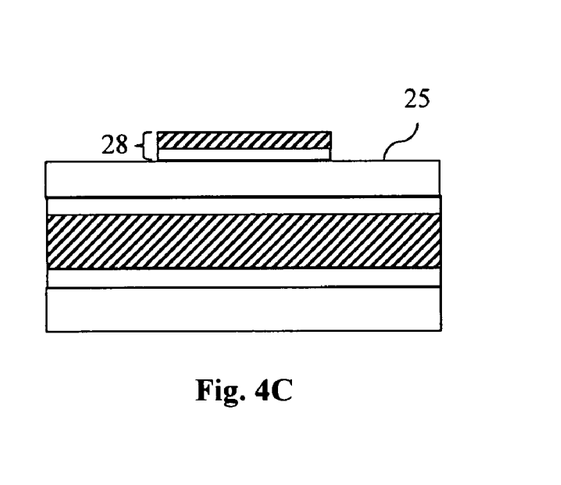
Figure 4D:
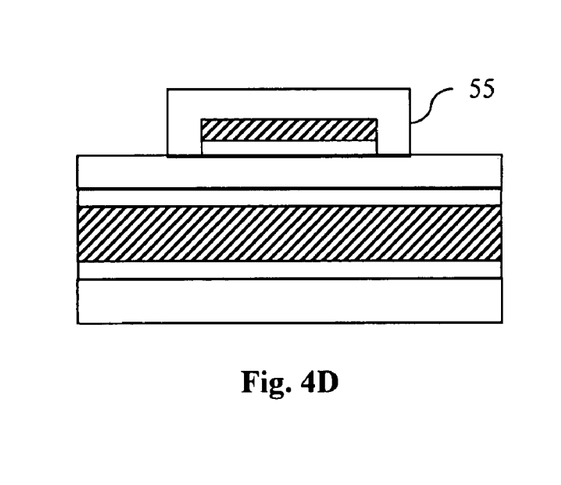
Figure 4E:
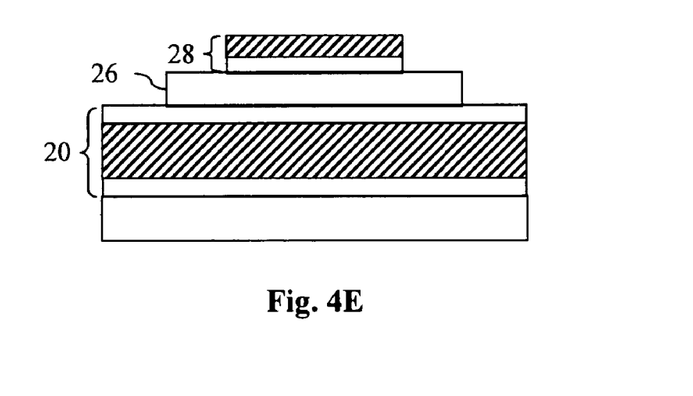
Figure 4F:
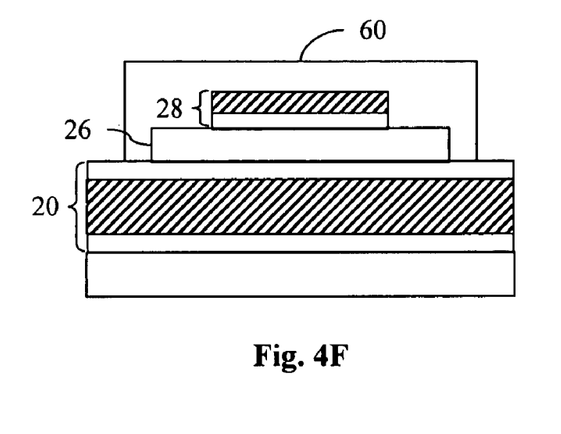
Figure 4G:
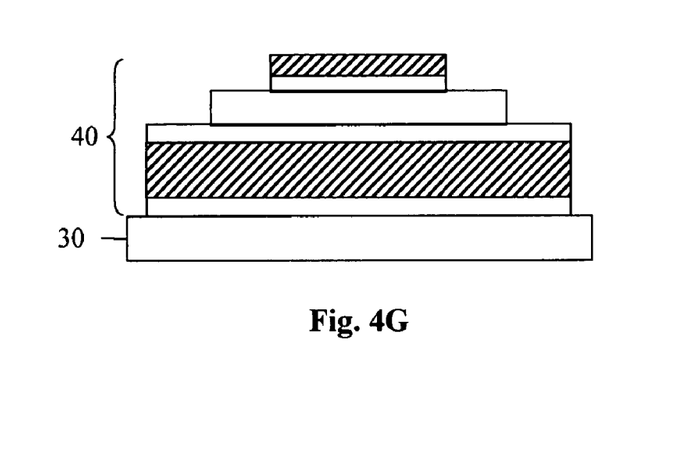
Figure 4H:
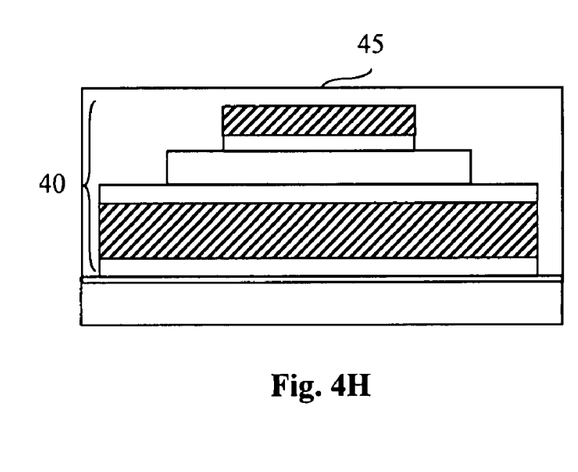

Prior to embedding the present capacitors in an electronic device, such as a printed circuit board, they may be etched to form discrete capacitors, or alternatively, used as a sheet to form a distributed capacitor. The formation of embedded discrete capacitors is illustrated in FIGS. 4A–4H. Capacitor 35 having first electrode (nickel-coated copper foil) 20 having a first surface having an Ra value of $\leq 200$ nm, an Rz(din) value of $\leq 2000$ nm, and a W value of $\leq 250$ nm (not shown) adjacent to capacitor dielectric material layer 25, such as BST, and second electrode (copper plated electroless nickel) 27 on polymeric laminate dielectric 30 is provided, see FIG. 4A. It will be appreciated that the surface of first electrode opposite to the first surface may be rougher than the first surface to provide sufficient adhesion to a subsequently applied polymer dielectric material (not shown). On second electrode 27 is disposed a photoresist (either dry film or liquid, such as RADIANCE or SN 35, both available from Rohm and Haas Electronic Materials, Marlborough, Mass.), the photoresist is imaged at the appropriate wavelength and developed to provide patterned photoresist 50, as shown in FIG. 4B, which exposes a portion of second electrode 27 bared of photoresist. Next, the second electrode is etched, such as with 2N HCl/10% $CuCl_2$, which removes areas of the second electrode bared of photoresist. Patterned photoresist 50 is then stripped to provide a capacitor having patterned second electrode 28 and exposed areas of capacitor dielectric layer 25, as shown in FIG. 4C. A second coating of photoresist is applied over the patterned top electrode. This photoresist is imaged at the appropriate wavelength and developed to provide patterned photoresist 55, as shown in FIG. 4D, where patterned photoresist 55 covers patterned second electrode 28 and a portion of capacitor dielectric material layer 25. Exposed portions of capacitor dielectric layer 25 are next removed, such as by etching with an appropriate ceramic etch, to provide the structure shown in FIG. 4E having patterned second electrode 28, patterned capacitor dielectric layer 26, and exposed portions of first electrode 20. A third coating of photoresist is applied over the patterned second electrode, the patterned capacitor dielectric layer and a portion of the first electrode. This photoresist is imaged at the appropriate wavelength and developed to provide patterned photoresist 60, as shown in FIG. 4F, where patterned photoresist 60 covers patterned second electrode 28, patterned capacitor dielectric layer 26 and a portion of first electrode 20. It will be appreciated that the capacitor could be utilized at this point as a distributed capacitor without further processing. Areas of the first electrode bared of photoresist are then etched, such as with 2N HCl/10% $CuCl_2$, and patterned photoresist 60 is then removed to provide discrete capacitor 40 on polymeric laminate dielectric 30 as shown in FIG. 4G. Next, discrete capacitor 40 is laminated to second polymeric laminate dielectric 45 which embeds discrete capacitor 40, as shown in FIG. 4H. In an alternate embodiment (not shown), second electrode, capacitor dielectric layer and first electrode may be etched in a single step.

Figure 5A:
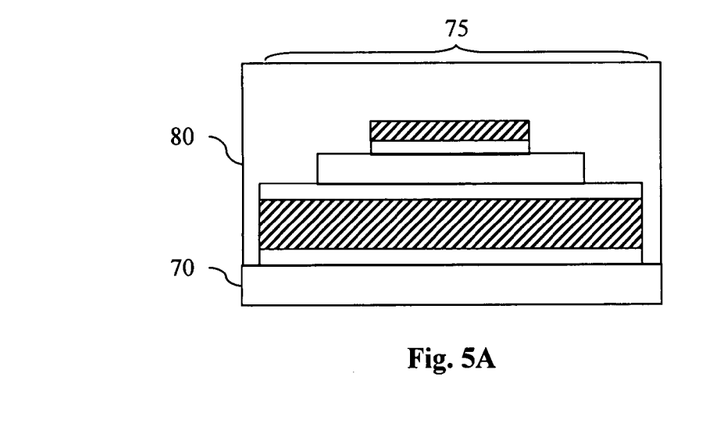
FIGS. 5A–5D illustrate one process of forming an embedded capacitor according to the invention.
Figure 5B:
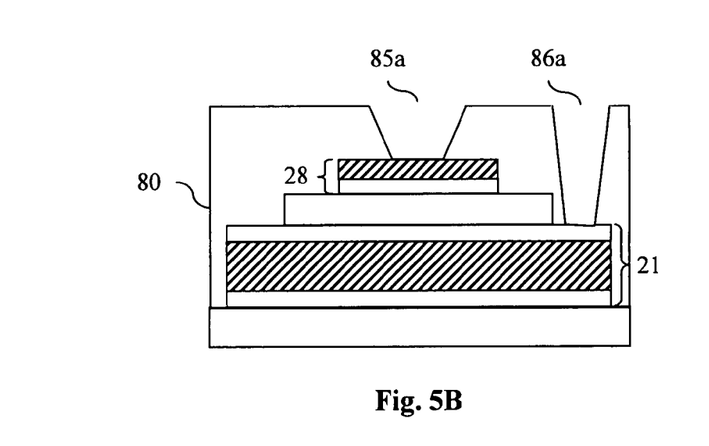
Figure 5C:
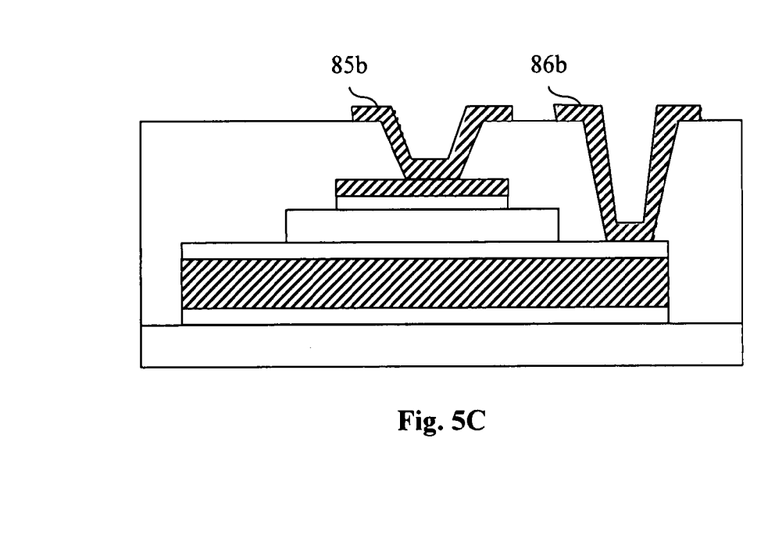
Figure 5D:
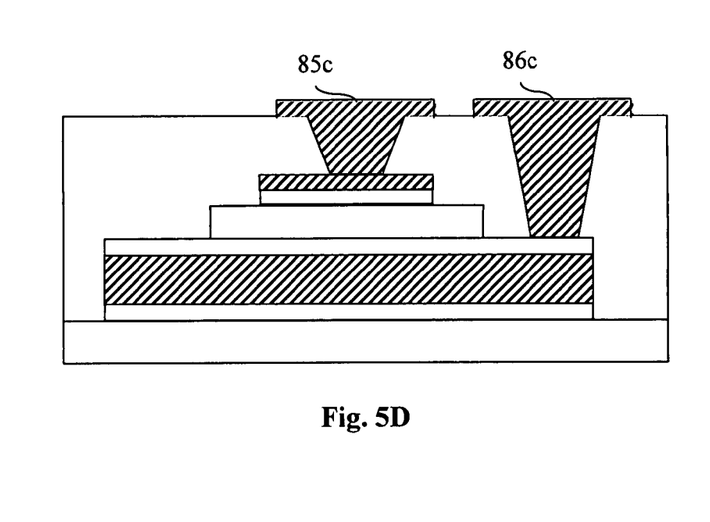

After a discrete capacitor is embedded in a laminate dielectric, contacts to the top and bottom electrodes are formed. FIG. 5A illustrates discrete capacitor 75 disposed on polymeric laminate dielectric 70 and embedded in polymeric laminate dielectric 80. Polymeric laminate dielectric 80 may or may not be photoimageable. Vias are next provided in polymeric laminate dielectric 80. When the polymeric laminate dielectric is photoimageable, such vias may be formed using photoimaging techniques. Such vias may also be formed by drilling, such as laser drilling using a $CO_2$, YAG or other suitable laser. FIG. 5B illustrates an embedded discrete capacitor having first via 85a and second via 86a. First via 85a exposes patterned second electrode 28 and second via 86a exposes patterned first electrode 21. First contact 85b and second contact 86b are then formed in first via 85a and second via 86a, respectively, as shown in FIG. 5C. Such contacts may be formed by any suitable method, such as electroless plating. Alternate first contact 85c and alternate second contact 86c are shown in FIG. 5D. Alternate contacts 85c and 86c may be formed by any suitable method, such as by electroless plating, electroplating, or a combination of electroless plating and electroplating. A suitable electroplating process for forming the alternate contacts is the CUPULSE plating process (available from Rohm and Haas Electronic Materials).

Figure 6:
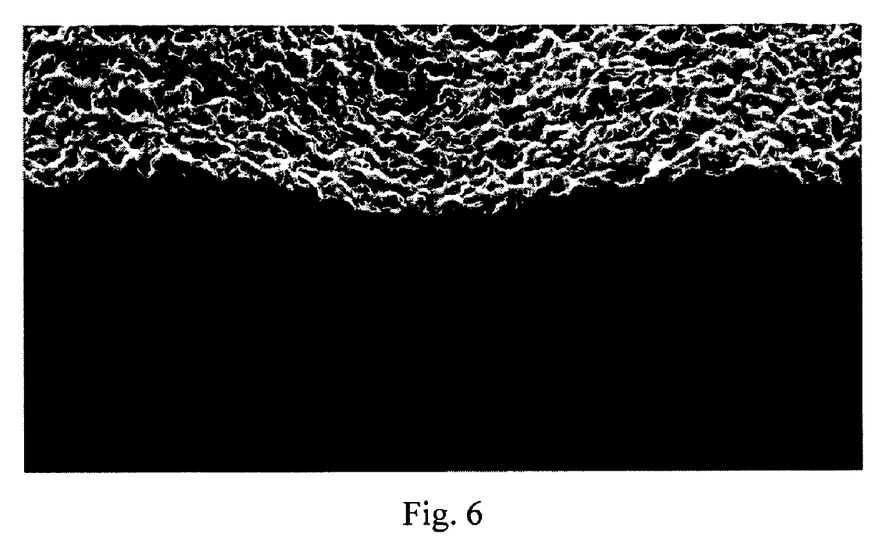
FIG. 6 illustrates a nickel-coated copper foil of the present invention.
Figure 7:
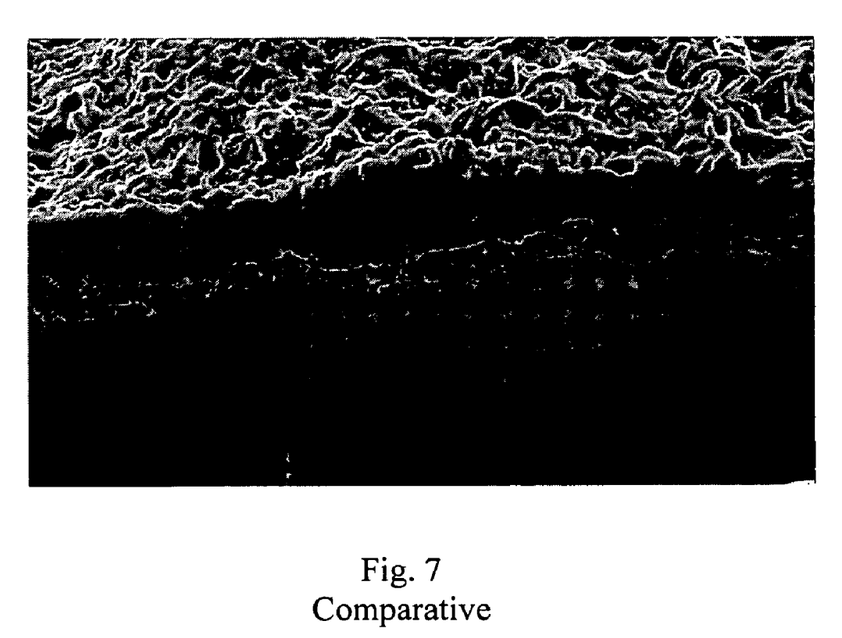
FIG. 7 illustrates a comparative nickel-coated copper foil.

An electrode was formed by electroplating a nickel-containing barrier layer on a copper foil having a thickness of 14 g per 929 $cm^2$ (0.5 ounces per square foot). The nickel-containing barrier layer included a first electrodeposited nickel layer, which was formed using a conventional nickel plating bath, and a second electrodeposited nickel layer of a nickel-phosphorus alloy. The bulk of the nickel-containing barrier layer contained $\leq 0.5$ atomic % of copper. The foil was annealed at 675° C. After annealing, no delamination of the nickel-containing barrier layer from the copper foil was observed. The surface of the electrode had an Ra value of $\leq 200$ nm, an Rz(din) value of $\leq 2000$ nm, and a W value of $\leq 250$ nm. See FIG. 6. In contrast, another electrode was prepared by electroplating a nickel-containing barrier layer containing 3–5 atomic % of copper on a copper foil having a thickness of 14 g per 929 $cm^2$ (0.5 ounces per square foot). This electrode was subjected to the same annealing conditions as those described above. After annealing, the nickel barrier layer was found to have significantly delaminated from the copper foil, as shown in FIG. 7.

What is claimed is:

1. A structure comprising an electrode having first and second surfaces and a capacitor dielectric material disposed on the first surface of the electrode, wherein the first surface of the electrode has an Ra value of $\leq 200$ nm, an Rz(din) value of $\leq 2000$ nm, and a W value of $\leq 250$ nm.

2. The structure of claim 1 wherein the electrode comprises a conductive layer and a barrier layer.

3. The structure of claim 1 wherein the capacitor dielectric material has a dielectric constant $\geq 10$.

4. A capacitor comprising the structure of claim 1 and further comprising a second electrode disposed on the capacitor dielectric material.

5. A structure comprising an electrode having first and second surfaces, a barrier layer disposed on the first surface of the electrode and a capacitor dielectric material disposed on the barrier layer, wherein the barrier layer is an electrodeposited nickel layer comprising <3 atomic % of copper.

6. The structure of claim 5 wherein the capacitor dielectric material has a dielectric constant $\geq 10$.

7. A capacitor comprising the structure of claim 5 and further comprising a second electrode disposed on the capacitor dielectric material.

8. A structure comprising an electrode comprising a copper conductive layer having first and second surfaces, a barrier layer having a thickness of 0.5 to 2 μm disposed on each of the first and second surfaces of the copper conductive layer and a capacitor dielectric material disposed on the barrier layer disposed on the first surface of the electrode, wherein each barrier layer is an electrodeposited nickel layer comprising <3 atomic % of copper, and wherein the capacitor dielectric material is chosen from ceramics, metal oxides, polymeric materials and combinations thereof.

9. The structure of claim 8 wherein the first surface has an Ra value of $\leq 200$ nm, an Rz(din) value of $\leq 2000$ nm, and a W value of $\leq 250$ nm.

10. A method of forming an electrode structure comprising the steps of providing a metal foil having a first surface, contacting the metal foil with a nickel electroplating bath and applying sufficient anodic potential to deposit a layer of nickel on the first surface of the metal foil wherein the nickel-plated first surface has an Ra value of $\leq 200$ nm, an Rz(din) value of $\leq 2000$ nm, and a W value of $\leq 250$ nm.

* * * * *